United States Patent
Suda et al.

(10) Patent No.: US 7,665,004 B2
(45) Date of Patent: Feb. 16, 2010

(54) TIMING GENERATOR AND SEMICONDUCTOR TESTING APPARATUS

(75) Inventors: Masakatsu Suda, Tokyo (JP); Masahiro Ishida, Tokyo (JP); Daisuke Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 605 days.

(21) Appl. No.: 11/570,042

(22) PCT Filed: Jun. 6, 2005

(86) PCT No.: PCT/JP2005/010348

§ 371 (c)(1), (2), (4) Date: Dec. 4, 2006

(87) PCT Pub. No.: WO2005/121827

PCT Pub. Date: Dec. 22, 2005

(65) Prior Publication Data

US 2009/0132884 A1    May 21, 2009

(30) Foreign Application Priority Data

Jun. 9, 2004    (JP)    ............................. 2004-170704

(51) Int. Cl.
*G06F 11/00*    (2006.01)

(52) U.S. Cl. .................. 714/744; 714/738; 714/703; 714/707; 714/739; 714/745; 714/814; 327/265; 327/279; 327/286; 327/170; 327/107; 375/371; 375/226; 702/69; 370/516

(58) Field of Classification Search ...................... None
See application file for complete search history.

(56) References Cited

U.S. PATENT DOCUMENTS

| | | | | |
|---|---|---|---|---|
| 3,916,329 A | * | 10/1975 | Hekimian et al. | ............ 327/265 |
| 5,394,106 A | * | 2/1995 | Black et al. | .................. 327/107 |
| 6,998,893 B2 | * | 2/2006 | Takahashi et al. | ............ 327/170 |
| 7,230,981 B2 | * | 6/2007 | Hill | .............................. 375/226 |
| 2005/0044463 A1 | * | 2/2005 | Frisch | .......................... 714/738 |
| 2005/0097420 A1 | * | 5/2005 | Frisch et al. | ................. 714/742 |

FOREIGN PATENT DOCUMENTS

| | | | |
|---|---|---|---|
| JP | 54-099539 | * | 8/1979 |
| JP | 08-050156 | | 2/1996 |
| JP | 11-23666 | | 1/1999 |
| JP | 2000-2757 | | 1/2000 |

* cited by examiner

*Primary Examiner*—John P Trimmings
(74) *Attorney, Agent, or Firm*—patenttm.us

(57) ABSTRACT

A timing generator that needs no analog circuit for adding jitters and allows the circuit scale and power consumption to be reduced. There are included a counter for performing a counting operation synchronized with a reference clock signal: a timing memory for outputting respective data corresponding to the quotient and remainder resulting from dividing the time from the front of a basic period until a generation of a timing edge by the period of the reference clock signal: a coincidence detecting circuit for outputting a signal that exhibits a high level when the count value of the counter coincides with the quotient: a jitter generating circuit for outputting as a jitter amplitude value: adders for adding a time corresponding to the remainder and a time represented by the jitter amplitude value outputted from the jitter generating circuit: and a variable delay circuit for delaying the output signal from the coincidence detecting circuit by the time represented by the addition result of the adders and outputting the delayed output signal.

9 Claims, 5 Drawing Sheets

TIMING GENERATOR AND SEMICONDUCTOR TESTING APPARATUS

TECHNICAL FIELD

The present invention relates to a timing generator used for a semiconductor testing apparatus, and the like.

BACKGROUND ART

One of test items for various devices such as for high-speed communication and high-speed serial interface is a jitter tolerance test. In this test, confirmation is made as to whether or not a device normally operates when jitter is added to clock signals or data, which are inputted to the device.

A semiconductor testing apparatus is an apparatus for conducting various tests for devices. In case the jitter tolerance test is conducted using the semiconductor testing apparatus, jitter is required to be added to timing edges produced by a timing generator. Known jitter generators for adding jitter to clock signals or the like include one having a configuration in which a variable delay circuit is provided for delaying clock signals or the like (refer to Patent Document 1, for example). In this jitter generator, sinusoidal offset voltage and output voltage of a ramp generator are compared with each other to impart sinusoidal fluctuation to the timing of alteration of the clock signals.

Patent Document 1: Japanese Patent Laid-Open No. 6-104708 (pp. 3 and 4, and FIGS. 1 to 3)

DISCLOSURE OF THE INVENTION

Since the jitter generator disclosed in Patent Document 1 is made up of analog circuits, such as an oscillator and a ramp generator, both of which generate sinusoidal offset voltage, and a voltage comparator, a problem has been raised that the scale of the circuit becomes large and lots of power is consumed. Generally, since a timing generator is a logical LSI that produces timing edges, locating a jitter generator made up of analog circuits in such an LSI is not preferable, or has been problematic. For example, if both of digital circuits and analog circuits are present in an LSI, such inconveniences are caused as to complicate the manufacturing processes, by which the manufacturing cost is raised, or to turn the analog circuits to noise sources for the digital circuits.

The present invention has been made in light of such problems, and has as its object to provide a timing generator which enables addition of jitter to output signals and dispenses with analog circuits for adding jitter to reduce a circuit scale and power consumption.

In order to solve the problems provided above, the timing generator of the present invention generates a timing edge at a specified timing within a basic period and includes; a counter for performing counting operation synchronizing with reference clock signals of a predetermined period; a timing data output unit for outputting data for each of a quotient and a remainder obtained by dividing time from the start of the basic period to the point of generating the timing edge by the period of the reference clock signals; an elapsed time determination unit for determining that time corresponding to the quotient, which is indicated by data outputted from the timing data output unit, has elapsed, on the basis of a count value of the counter, and for outputting a determination signal in accord with the timing of the determination; a jitter generation unit for outputting time, by which the output timing of the timing edge should be delayed, as a jitter amplitude value; an adding unit for performing additions of a first time corresponding to the remainder indicated by the data outputted from the timing data output unit, and a second time indicated by the jitter amplitude value outputted from the jitter generation unit; and a variable delay unit to which the determination signal outputted from the elapsed time determination unit is inputted so as to be outputted with a delay by the time indicated by an addition result obtained from the adding unit. When using a variable delay unit in generating a timing edge, delay time in the variable delay unit is changed by the time corresponding to the jitter amplitude value to enable addition of jitter to the timing edge. Thus, jitter can be added to a timing edge as an output signal, by only additionally providing a digital circuit for adding a jitter amplitude value in a configuration for setting delay time for the variable delay unit, whereby a circuit scale and power consumption can be reduced.

The elapsed time determination unit mentioned above compares the count value of the counter with the quotient indicated by data outputted from the timing data output unit and outputs the determination signal when the count value and the quotient coincide with each other. Alternatively, the counter mentioned above preferably retrieves the quotient as an initial value at the start of the basic period, the quotient being indicated by the data outputted from the timing data output unit, and then perform a counting operation for reducing a count value synchronizing with the reference clock signals, and the elapsed time determination unit preferably outputs the determination signal when the count value of the counter is detected to be "0". Thus, elapsed time corresponding to an integral multiple of the period of the reference clock signals can be readily determined.

The jitter generation unit mentioned above preferably outputs the jitter amplitude values which alter in a sinusoidal manner synchronizing with the output of the timing edges. Thus, sinusoidal jitter can be readily added to output signals, and the added sinusoidal jitter has very high frequency being in synchronization with the output of the timing edges.

The jitter generation unit mentioned above preferably outputs the jitter amplitude values which alter at random synchronizing with the output of the timing edges. Thus, random jitter can be readily added to output signals, and the added random jitter has very high frequency being in synchronization with the output of the timing edges.

The jitter generation unit mentioned above preferably outputs the jitter amplitude values whose updating intervals alter at random. By making the intervals for adding jitter components uneven, random jitter having enhanced random properties can be added.

The adding unit mentioned above, when an addition result corresponding to one period or more of the reference clock signals has been obtained, preferably outputs a carry and an addition result of less than one period of the reference clock signals based on the former addition result, and an input timing delay unit preferably be further provided so that, when the carry is outputted, the timing for inputting the determination signal, which is outputted from the elapsed time determination unit, into the variable delay unit can be delayed during the time corresponding to an integral multiple of the period of the reference clock signals. Thus, the timing for generating the timing edge can be ensured to be delayed by the time corresponding to an integral multiple of the period of the reference clock signals.

The adding unit mentioned above preferably further performs addition of time, which is equivalent to a time lag, to the first time and the second time, the time lag being caused when the start timing of the basic period and the input timing of the reference clock signal do not coincide with each other. Thus, the start timing of the basic period can be set asynchronously with the reference clock signal, whereby a plurality of basic periods each having arbitrary value can be successively set.

A semiconductor testing apparatus of the present invention includes: the timing generator mentioned above; a pattern generator for generating a pattern data to be inputted to each of pins of a device under test; a data selector for correlating each of the various pattern data outputted from the pattern generator to each of the pins of the device under test to which the pattern data is inputted; a format controlling section for controlling a waveform for the device under test, based on the pattern data outputted from the data selector and the timing edge generated by the timing generator; and a digital comparing section for comparing the data outputted from each of the pins of the device under test with an expected value data of each of the pins. Thus, jitter can be added to the signals inputted to the device under test from the semiconductor testing apparatus without additionally providing analog circuits, whereby a circuit scale and power consumption can be reduced in conducting a jitter tolerance test using the semiconductor testing apparatus.

DESCRIPTION OF SYMBOLS

Figure 1:
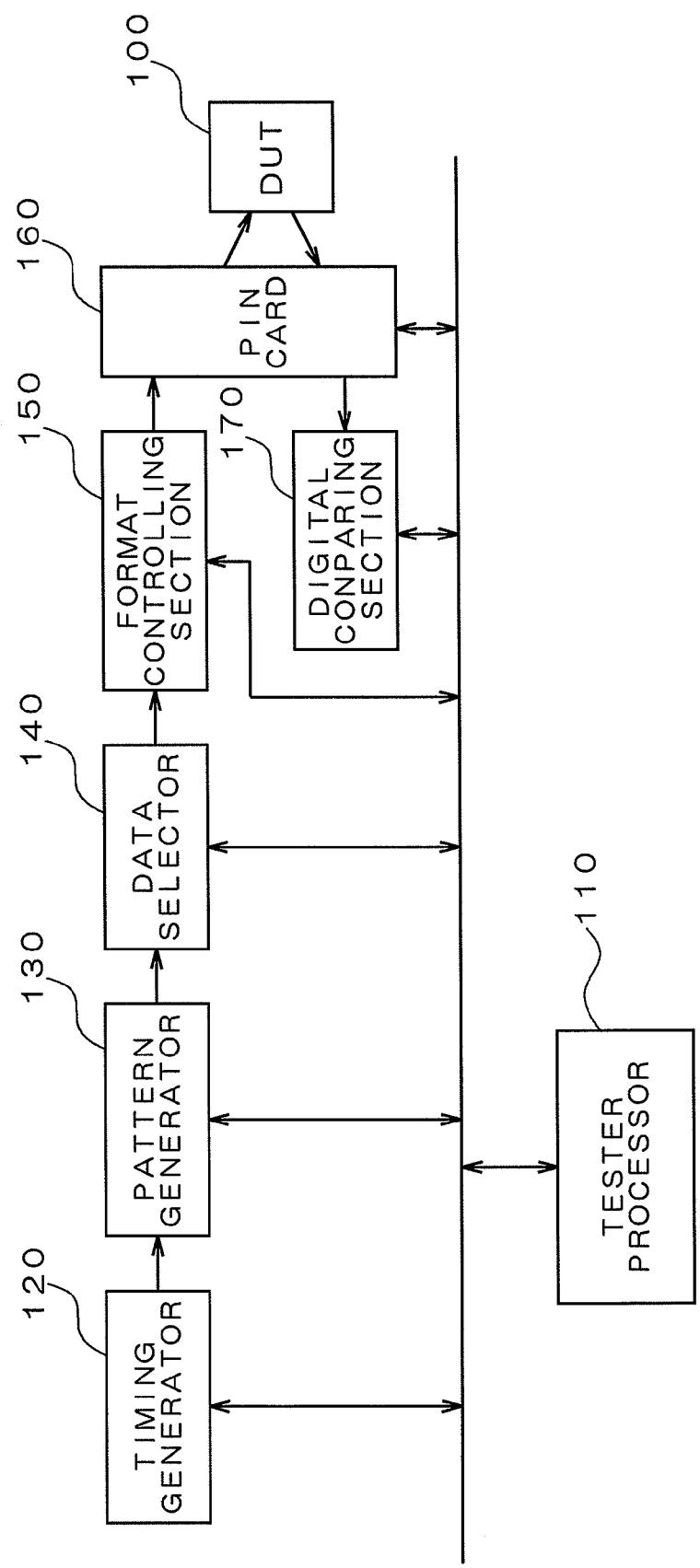
FIG. 1 shows an entire configuration of a semiconductor testing apparatus equipped with a timing generator according to an embodiment.

10 Counter
12 Timing memory
14 Coincidence detecting circuit
16 Multiplexer
18, 20, 22 D-type flip flops
24 RATE memory
26, 28, 30 Adders
32 Jitter generating circuit
34 Inverter circuit
36, 38 AND circuits
40 FIFO memory
42 Variable delay circuit
100 DUT
110 Tester processor
120 Timing generator
130 Pattern generator
140 Data selector
150 Format controlling section
160 Pin card
170 Digital comparing section

BEST MODE FOR CARRYING OUT THE INVENTION

With reference to the drawings, hereinafter is described a timing generator according to an embodiment to which the present invention is applied.

FIG. 1 shows an entire configuration of a semiconductor testing apparatus equipped with the timing generator according to an embodiment. The semiconductor testing apparatus shown in FIG. 1 is for conducting various tests including the jitter tolerance test for a DUT (device under test) 100, and is configured including a tester processor 110, a timing generator 120, a pattern generator 130, a data selector 140, a format controlling section 150, a pin card 160 and a digital comparing section 170, so that various signals required for the tests can be inputted/outputted to/from the DUT 100.

The tester processor 110 mentioned above executes predetermined programs with an operating system (OS) to control the entire semiconductor testing apparatus so that the various tests for the DUT 100 can be conducted. The timing generator 120 sets basic periods required for the tests, and at the same time, produces various timing edges to be contained in the set basic periods. The pattern generator 130 generates a pattern data to be inputted to each of pins, including a clock pin, of the DUT 100. The data selector 140 correlates each of the various pattern data outputted from the pattern generator 130 to each of the pins of the DUT 100 to which the pattern data is inputted. The format controlling section 150 performs waveform control for the DUT 100 based on the pattern data generated by the pattern generator 130 and selected by the data selector 140, and the timing edge generated by the timing generator 120.

The pin card 160 serves to provide a physical interface between the format controlling section 150 and the DUT 100, and between the digital comparing section 170 and the DUT 100. The pin card 160 is configured including: a driver for supplying a predetermined patterned waveform to a correlated pin of the DUT 100; a dual comparator for performing a comparison between a voltage waveform appearing on the pin and a predetermined low-level voltage, simultaneously with a comparison between the voltage waveform appearing on the pin and a high-level voltage; a programmable load at which any value of a load current can be set; and a terminating resistor connected to each of the pins and having a predetermined resistance (e.g., 50Ω). It should be appreciated that some pins of the DUT 100, such as a pin for an address terminal, are provided only for inputting predetermined data, and that such pins do not require the dual comparator, the programmable load or the terminating resistor and thus are connected with only the driver. The digital comparing section 170 compares output of each pin of the DUT 100 with an expected value for each pin selected by the data selector 140. The timing for performing the comparison is specified by a timing edge STRB of a strobe signal produced by the timing generator 120.

Figure 2:
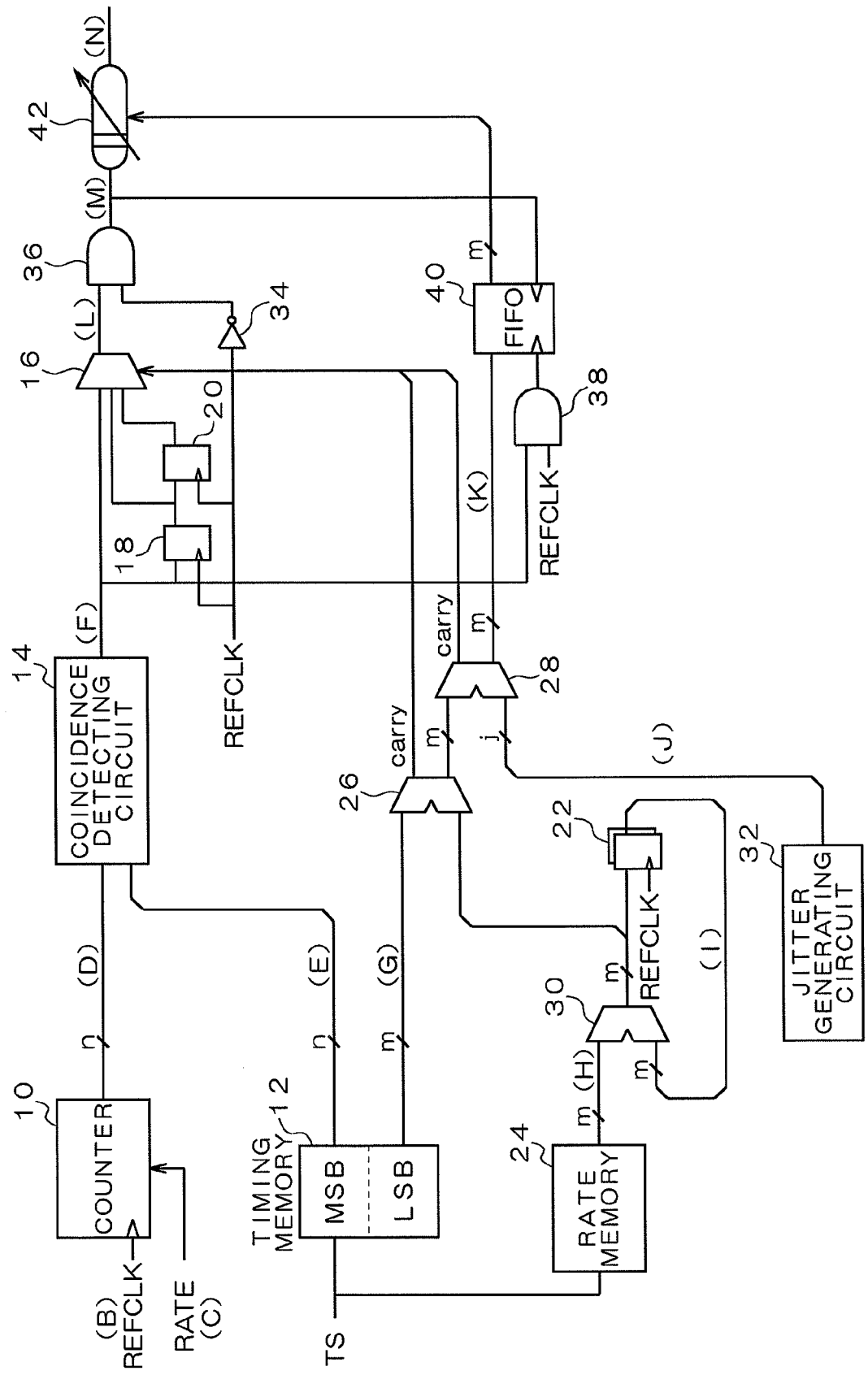
FIG. 2 shows a detailed configuration of the timing generator.

FIG. 2 shows a detailed configuration of the timing generator 120. As shown in FIG. 2, the timing generator 120 is configured including a counter 10, a timing memory 12, a coincidence detecting circuit 14, a multiplexer 16, D-FFs (D-type flip flops) 18, 20 and 22, a RATE memory 24, adders 26, 28 and 30, a jitter generating circuit 32, an inverter circuit 34, AND circuits 36 and 38, a FIFO memory 40 and a variable delay circuit 42.

The counter 10 is reset by a RATE signal and performs counting operation in synchronization with REFCLK (reference clock) signals. The RATE signal is for setting a basic period required for tests, which signal is set at a higher level by one period of the REFCLK signals, the one period being in accord with the start timing of the basic period. The REFCLK signal has a period of 4 ns, for example.

The timing memory 12 is provided for storing temporal data indicating the timing for generating a timing edge with the start timing of the basic period as a reference. In particular, the temporal data corresponding to an integral multiple of the REFCLK signal period (a value indicative of a quotient obtained by dividing the basic period by the period of the reference clock signals) is stored at high-order n bits (MSBs), and the temporal data equal to or less than this period (a value indicative of a remainder obtained by dividing the basic period by the period of the reference clock signals) is stored at low-order m bits (LSBs). An address signal (TS signal) is inputted synchronizing with the RATE signal, while the temporal data of (n+m) bits indicative of the timing for generating the timing edge in the basic period, which period is set in accord with the RATE signal, is read out from the timing memory 12.

The coincidence detecting circuit 14, into which a count value (n bits) of the counter 10 and the temporal data at the high-order n bits in the timing memory 12 are inputted, carries out matching for all of the bits. When all of these bits coincide, a level of the output of the coincidence detecting circuit 14 turns high. The RATE memory 24 is provided for storing the m-bit data which is a remainder obtained by dividing a preceding basic period by the REFCLK signal period.

The adder 30 performs addition of the m-bit data read out from the RATE memory 24 and the m-bit data stored in the D-type flip flop 22. The results of this are stored in the D-type flip flop 22 in synchronization with the REFCLK signals. Accordingly, data of remainders each obtained by dividing each of the basic periods by the REFCLK signal period are accumulated using the adder 30 and the D-type flip flop 22.

The adder 26 performs addition of the low-order m-bit data in the timing memory 12 and the m-bit data outputted from the adder 30 mentioned above. An addition result of the m bits is inputted to the adder 28 in the subsequent stage. In this addition process, if carrying-over occurs from the most significant bits, a carry is transmitted to the multiplexer 16. The adder 28 performs addition of the m-bit data outputted from the previous adder 26 and a jitter component data of the m bits outputted from the jitter generating circuit 32. An addition result of the m bits is inputted to the FIFO memory 40. In this addition process, if carrying-over occurs from the most significant bits, a carry is transmitted to the multiplexer 16.

The multiplexer 16, into which signals (1-bit data) outputted from the coincidence detecting circuit 14 and signals outputted from each of the two D-type flip flops 18 and 20 are inputted, performs selection operation according to the carries transmitted from the adders 26 and 28. The D-type flip flop 18 retrieves and retains the signals outputted from the coincidence detecting circuit 14, in synchronization with the REFCLK signals. The D-type flip flop 20 retrieves and retains the signals outputted from the D-type flip flop 18, in synchronization with the REFCLK signals. In this way, the signals outputted from the coincidence detecting circuit 14, the signals obtained by delaying the signals outputted from the coincidence detecting circuit 14 by one period of the REFCLK signals, and the signals obtained by delaying the signals outputted from the coincidence detecting circuit 14 by two periods of the REFCLK signals are inputted to the multiplexer 16. The multiplexer 16 output signals according to the presence of the carries outputted from each of the two adders 26 and 28. To be concrete, in case no carry is inputted, the output signals of the coincidence detecting circuit 14 are selectively outputted. In case only either one of the carry is inputted, the output signals of the D-type flip flop 18 (the signals obtained by delaying the output signals of the coincidence detecting circuit 14 by one period of the REFCLK signals) are selectively outputted. In case both of the carries are inputted, the output signals of the D-type flip flop 20 (the signals obtained by delaying the output signals of the coinci- dence detecting circuit 14 by two periods of the REFCLK signals) are selectively outputted. The AND circuit 36, into which the output signals of the multiplexer 16 and signals obtained by inverting the REFCLK signals by the inverter 34 are inputted, outputs AND signals for these two types of signals.

The jitter generating circuit 32 generates jitter component data. The FIFO memory 40 retrieves the m-bit data outputted from the adder 28, in synchronization with output signals (signals resulting of AND operation of the output signals of the coincidence detecting circuit 14 and the REFCLK signals) of the AND circuit 38, and outputs the retrieved data in the inputted order in synchronization with output signals of the AND circuit 36. The variable delay circuit 42 has a maximum variable delay amount equivalent to one period of the REFCLK signals and outputs the output signals of the AND circuit 36 with a delay time corresponding to the m-bit data outputted from the FIFO memory 40.

Figure 3:
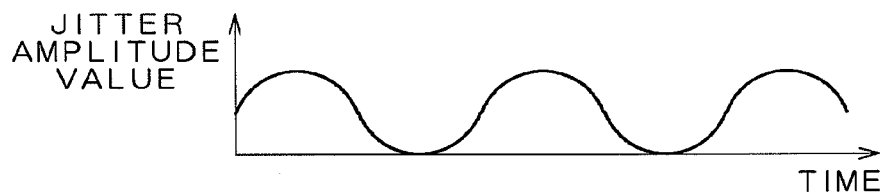
FIG. 3 shows the principle of operation of a jitter generating circuit.

FIG. 3 is an explanatory view for the principle of operation of the jitter generating circuit 32, and shows a case where sinusoidal jitter, for example, is added to the timing edge produced by the timing generator 120. In FIG. 3, the horizontal axis indicates elapsed time and the vertical axis indicates a jitter amplitude value indicative of a value of the sinusoidal jitter to be added. The jitter generating circuit 32 produces and outputs, as shown in FIG. 3, data of j-bit jitter amplitude value which periodically changes with the lapse of time.

Figure 4:
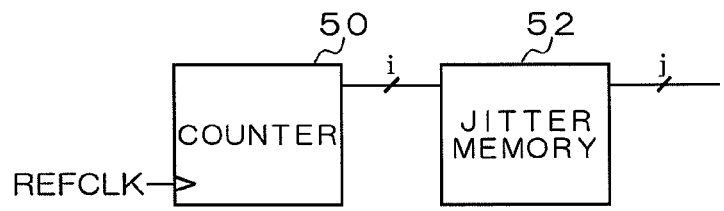
FIG. 4 shows an example of detailed configuration of the jitter generating circuit.

FIG. 4 shows an example of a specific configuration of the jitter generating circuit 32. The jitter generating circuit shown in FIG. 4 is provided with a counter 50 and a jitter memory 52. The counter 50 performs counting operation in synchronization with the REFCLK. The jitter memory 52 stores the j-bit jitter amplitude value data in addresses specified by the count values of the counter 50. The jitter amplitude value data are sequentially read out as the counting operation of the counter 50 advances in synchronization with the REFCLK signals. In case the jitter memory 52 is used, various types of jitter can be readily generated as well as the sinusoidal jitter shown in FIG. 3 if only the contents of the data of the jitter amplitude values to be stored are changed. Moreover, synchronization with the reference clock signals may allow addition of jitter having very high frequency, which is synchronized with the outputs of the timing edges.

Figure 5:
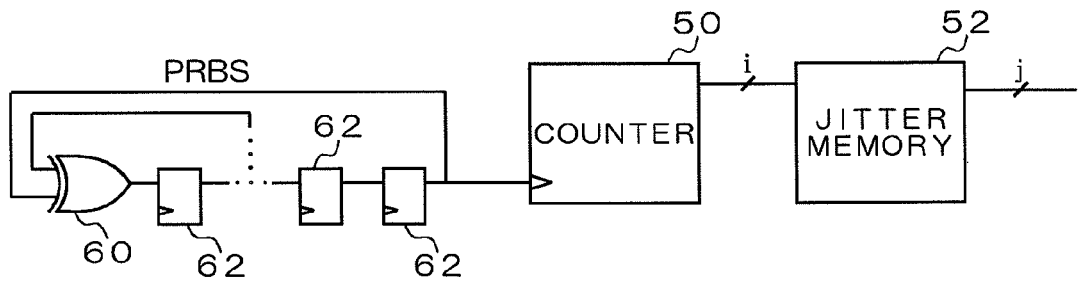
FIG. 5 shows another example of detailed configuration of the jitter generating circuit.

FIG. 5 shows an example of another specific configuration of the jitter generating circuit 32. The jitter generating circuit 32 shown in FIG. 5 is provided with an exclusive OR circuit 60, a plurality of D-type flip flops 62, a counter 50 and a jitter memory 52. The counter 50 and the jitter memory 52 are the same as the ones shown in FIG. 4. A random bit string generating circuit configured by the exclusive OR circuit 60 and an N number of the D-type flip flops 62 in cascade connection, is provided at the preceding stage of the counter 50. Two output values from among the N number of D-type flip flops 62 are inputted into the exclusive OR circuit 60. Exclusive OR signals of these two output values are inputted to a predetermined D-type flip flop 62 (e.g., the first one). Thus generated random bit strings are inputted to the counter 50 as clock signals. In this way, while the configuration shown in FIG. 4 has allowed regular counting operation of the counter 50 in synchronization with the REFCLK signal, the configuration shown in FIG. 5 is different from the configuration in FIG. 4 in that the configuration in FIG. 5 allows irregular counting operation of the counter 50 according to the contents of the random bit strings. The unevenness of the intervals with which the jitter components are added may allow the addition of jitter having temporal random properties.

Figure 6:
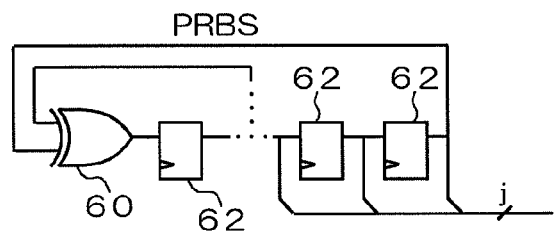
FIG. 6 shows another specific example of the jitter generating circuit.

FIG. 6 shows another specific example of the jitter generating circuit 32. The jitter generating circuit shown in FIG. 6 is provided with a random bit string generating circuit configured by an exclusive OR circuit 60 and a plurality of D-type flip flops 62. The random bit string generating circuit, per se, is the same as the one included in the configuration shown in FIG. 5. In this circuit, a "j" number of outputs are parallelly retrieved from among the plurality of D-type flip flops 62 for use as a j-bit jitter amplitude value data. Owing to this, random jitter can be readily produced. Moreover, owing to this, random jitter having very high frequency and in synchronization with the outputs of the timing edges can be added.

Figure 7:
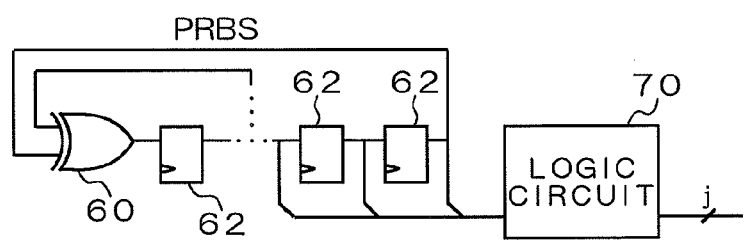
FIG. 7 shows another specific example of the jitter generating circuit.

FIG. 7 shows still another specific example of the jitter generating circuit 32. The jitter generating circuit shown in FIG. 7 is provided with an exclusive OR circuit 60, a plurality of D-type flip flops 62 and a logic circuit 70. The random bit string generating circuit, per se, which is configured by the exclusive OR circuit 60 and the plurality of D-type flip flops 62, is the same as the one included in the configuration shown in FIG. 5, and is connected with the logic circuit 70 at the subsequent stage thereof. The logic circuit 70, into which outputs of all or some of the plurality of D-type flip flops 62 are parallelly inputted, performs predetermined processes for these plural-bit data. The predetermined processes include, for example, a process for setting an upper limit and a lower limit of data to mask data outside this range, or a process for performing calculation based on a predetermined formula to convert the value of the data. The j-bit data outputted from the logic circuit 70 is used as the jitter amplitude value data.

The timing memory 12 described above corresponds to the timing data output unit, the coincidence detecting circuit 14 corresponds to the elapsed time determination unit, the jitter generating circuit 32 corresponds to the jitter generation unit, the adders 26, 28 and 30 each correspond to the adding unit, the variable delay circuit 42 corresponds to the variable delay unit, and the multiplexer 16 and the D-type flip flops 18 and 20 each correspond to the input timing delay unit.

Figure 8:
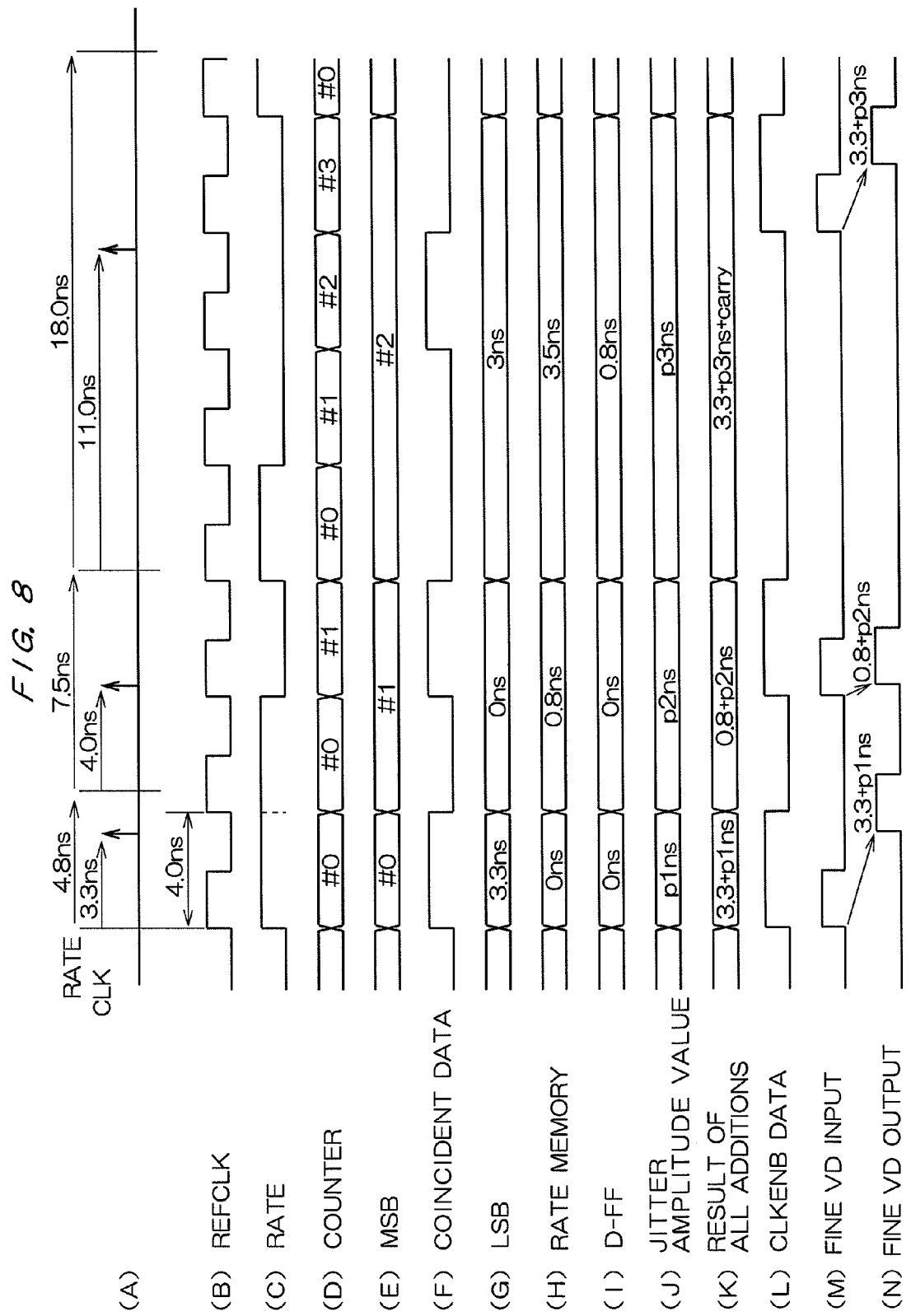
FIG. 8 is a timing diagram showing an operation of the timing generator of the present embodiment.

The timing generator 120 of the present embodiment has the configuration as described above. The timing generator 120 is described hereinafter from the viewpoint of its operation. FIG. 8 is a timing diagram showing an operation of the timing generator 120 according to the present embodiment. For example, in the timing diagram, the period of the REFCLK signals is set at 4 ns, the basic periods set by the RATE signals are sequentially set at 4.8 ns, 7.5 ns and 18.0 ns, and the timings for generating the timing edges within the basic periods are set at 3.3 ns, 4.0 ns and 11.0 ns, respectively (FIG. 8 (A)).

(1) Operation in Accord with the Basic Period 4.8 ns and the Timing Edge 3.3 ns

When the RATE signal corresponding to the basic period 4.8 ns is inputted, the counter 10 starts counting operation in synchronization with the REFCLK signals and outputs a first count value "0" (FIGS. 8 (C) and (D)). In parallel with this counting operation, an operation is performed for reading out, from the timing memory 12, the data of the high-order n bits (MSBs) and the low-order m bits (LSBs) corresponding to the generation timing 3.3 ns of the timing edge. Since the generation timing 3.3 ns of the timing edge is smaller than 4.0 ns of the REFCLK signal period, a high-order n-bit data with contents of "0" and a low-order m-bit data with contents of value equivalent to 3.3 ns are read out (FIGS. 8 (E) and (G)). The read out high-order n-bit data "0" is inputted to the coincidence detecting circuit 14, and the low-order m-bit data is inputted to the adder 26. It should be appreciated that, prior to performing reading of the data from the timing memory 12 or the RATE memory 24, a process for writing these data, for example, is taken under the control of the tester processor 110.

The coincidence detecting circuit 14 compares the n-bit data "0" read out from the timing memory 12 with the first count value "0" of the counter 10. In this case, since the two values coincide with each other, a high-level signal is outputted from the coincidence detecting circuit 14 (FIG. 8 (F)).

The m-bit data, i.e. the remainder obtained by dividing the preceding basic period by the REFCLK signal period, is to be read out from the RATE memory 24, however, since there is no previously obtained remainder at this point of time, the m-bit data indicative of 0 ns is read out (FIG. 8 (H)). Further, from the D-type flip flop 22, the m-bit data, which has been read out from the RATE memory 24 for retainment therein (the m-bit data with contents of an initial value "0" (=0 ns) as there is no previously retained data currently) in accord with the preceding basic period, is read out (FIG. 8 (I)). Furthermore, the j-bit data equivalent to a jitter amplitude value p1 is read out from the jitter generating circuit 32 (FIG. 8 (J)).

Thus, an m-bit data equivalent to (3.3+p1) ns is obtained as a result of all the additions using the three adders 26, 28 and 30 (FIG. 8 (K)). If the value p1 is less than 0.7 ns, the addition result will be 4.0 or less and no carry is produced. Accordingly, the output signals of the coincidence detecting circuit 14 are selected in the multiplexer 16, and the level of the output signals of the multiplexer 16 turns higher by one period of the REFCLK signals (FIG. 8 (L)). Thus, during the time corresponding to the high-level zone of the REFCLK signals, signals for maintaining the high level are outputted from the AND circuit 36 and are inputted to the variable delay circuit 42 having high-resolution (FIG. 8 (M)). The variable delay circuit 42 outputs the signals inputted from the AND circuit 36 with a delay time corresponding to the m-bit data outputted from the FIFO memory 40. In this case, all the additions indicated by the m-bit data outputted from the adder 28 result in (3.3+p1) ns. This m-bit data indicative of the results of all the additions as outputted from the adder 28 are inputted to the variable delay circuit 42 through the FIFO memory 40, and thus the variable delay circuit 42 outputs the signals inputted from the AND circuit 36 with a delay of (3.3+p1) ns (FIG. 8 (N)).

If (3.3+p1) ns equals to 4.0 ns or more, a carry produced in the addition operation of the adder 28 is inputted to the multiplexer 16. At the same time, an m-bit data indicative of (3.3+p1-4.0) ns is outputted from the adder 28. In this case, since the output signals of the D-type flip flop 18 are selected in the multiplexer 16, the multiplexer 16 outputs signals resulting from delaying the output signals of the coincidence detecting circuit 14 by one period of the REFCLK signals. Accordingly, during the time corresponding to the high-level zone in the next period of the REFCLK signals, the AND circuit 36 outputs signals for maintaining the high level, which signals are inputted to the variable delay circuit 42. Thus, the variable delay circuit 42 outputs signals, which have been inputted from the AND circuit 36, with a delay of (3.3+p1-4.0) ns.

(2) Operation in Accord with the Basic Period 7.5 ns and the Timing Edge 4.0 ns

Upon input of the RATE signals corresponding to the basic period 7.5 ns, subsequent to the operation in accord with the basic period 4.8 ns as described above, the counter 10 resumes the counting operation from the initial value "0" in synchronization with the REFCLK signals. Since the preceding basic period 4.8 ns is shorter than two periods (8 ns) of the REFCLK signals, the RATE signals corresponding to the subsequent basic period 7.5 ns exhibit high level during a period corresponding to the second period of the REFCLK signals corresponding to the immediately preceding basic period 4.8 ns, and from this point onwards, exhibit low level (FIGS. 8 (B) and (C)).

In parallel with the counting operation of the counter 10, an operation is performed for reading out, from the timing memory 12, data of the high-order n bits (MSBs) corresponding to the generation timing 4.0 ns of the timing edge and data of the low-order m bits (LSBs). Since the generation timing 4.0 ns of the timing edge is equal to 4.0 ns which is the period of the REFCLK signals, a high-order n-bit data with contents of "1" and a low-order m-bit data with contents of value corresponding to 0.0 ns are read out (FIGS. 8 (E) and (G)). The read out high-order n-bit data "1" is inputted to the coincidence detecting circuit 14, and the low-order m-bit data is inputted to the adder 26.

The coincidence detecting circuit 14 compares the n-bit data "1" read out from the timing memory 12 with the initial count value "0" of the counter 10. In this case, since the two values do not coincide with each other, the coincidence detecting circuit 14 outputs low-level signals. When the counting of the counter 10 advances and the count value becomes "1", which coincides the n-bit data read out from the timing memory 12, the coincidence detecting circuit 14 outputs high-level signals (FIG. 8 (F)).

An m-bit data indicative of a remainder 0.8 ns obtained by dividing the preceding basic period 4.8 ns by the REFCLK signal period 4.0 ns, is read out from the RATE memory 24 (FIG. 8 (H)). Further, from the D-type flip flop 22, an m-bit data indicative of 0.0 ns, which has been read out from the RATE memory 24 for retainment therein in accord with the preceding basic period 4.8 ns, is read out (FIG. 8 (I)). Furthermore, a j-bit data corresponding to a jitter amplitude value p2 is read out from the jitter generating circuit 32 (FIG. 8 (J)).

Thus, an m-bit data equivalent to (0.8+p2) ns is obtained as a result of all the additions using the three adders 26, 28 and 30 (FIG. 8 (K)). If the value p2 is less than 3.2 ns, the addition result will be 4.0 or less and no carry is produced. Accordingly, the output signals of the coincidence detecting circuit 14 are selected in the multiplexer 16 to allow the level of the output signals of the multiplexer 16 to turn higher by one period of the REFCLK signals (FIG. 8 (L)). Thus, during the time corresponding to the high-level zone of the REFCLK signals, signals for maintaining the high level are outputted from the AND circuit 36 and are inputted to the variable delay circuit 42 having high-resolution (FIG. 8 (M)). The variable delay circuit 42 outputs the signals inputted from the AND circuit 36 with a delay time corresponding to the m-bit data outputted from the FIFO memory 40. In this case, all the additions indicated by the m-bit data outputted from the adder 28 result in (0.8+p2) ns. This m-bit data indicative of the results of all the additions as outputted from the adder 28 is inputted to the variable delay circuit 42 through the FIFO memory 40, and thus the variable delay circuit 42 outputs the signals inputted from the AND circuit 36 with a delay of (0.8+p2) ns (FIG. 8 (N)).

If (0.8+p2) ns equals to 4.0 ns or more, a carry produced in the addition operation of the adder 28 is inputted to the multiplexer 16. At the same time, an m-bit data indicative of (0.8+p2-4.0) ns is outputted from the adder 28. In this case, since the output signals of the D-type flip flop 18 are selected in the multiplexer 16, the multiplexer 16 outputs signals resulting from delaying the output signals of the coincidence detecting circuit 14 by one period of the REFCLK signals. Accordingly, during the time corresponding to the high-level zone in the next period of the REFCLK signals, the AND circuit 36 outputs signals for maintaining the high level, which signals are inputted to the variable delay circuit 42. Thus, the variable delay circuit 42 outputs signals, which have been inputted from the AND circuit 36, with a delay of (0.8+p2-4.0) ns.

(3) Operation in Accord with the Basic Period 18.0 ns and the Timing Edge 11.0 ns Upon input of the RATE signals corresponding to the basic period 18.0 ns, subsequent to the operation in accord with the basic period 7.5 ns as described above, the counter 10 resumes the counting operation from the initial value "0" in synchronization with the REFCLK signals. The sum of the previous basic periods 4.8 ns and 7.5 ns, i.e. 12.3 ns, is longer than three periods (12 ns) and shorter than four periods (16 ns) of the REFCLK signals. Therefore, the RATE signals corresponding to the subsequent basic period 18.0 ns exhibit high level during a period corresponding to one period of the REFCLK signals corresponding to the border between the immediately preceding basic period 7.5 ns and the current basic period 18.0 ns, and from the point onwards, exhibit low level (FIGS. 8 (B) and (C)).

In parallel with the counting operation of the counter 10, an operation is performed for reading out, from the timing memory 12, data of high-order n bits (MSBs) corresponding to the generation timing 11.0 ns of the timing edge and data of low-order "m" bits (LSBs). The generation timing 11.0 ns of the timing edge equals to the sum of twice of 4.0 ns, which is the period of the REFCLK signals, and 3.0 ns. In this case, therefore, a high-order n-bit data with contents of "2" and a low-order m-bit data with contents of value corresponding to 3.0 ns are read out (FIGS. 8 (E) and (G)). The read out high-order n-bit data "2" is inputted to the coincidence detecting circuit 14, and the low-order m-bit data is inputted to the adder 26.

The coincidence detecting circuit 14 compares the n-bit data "2" read out from the timing memory 12 with the initial count value "0" of the counter 10. In this case, since the two values do not coincide with each other, the coincidence detecting circuit 14 outputs low-level signals. When the counting of the counter 10 advances and the count value becomes "2", which coincides the n-bit data read out from the timing memory 12, the coincidence detecting circuit 14 outputs high-level signals (FIG. 8 (F)).

An m-bit data indicative of a remainder 3.5 ns, which is obtained by dividing the preceding basic period 7.5 ns by the REFCLK signal period 4.0 ns, is read out from the RATE memory 24 (FIG. 8 (H)). Further, from the D-type flip flop 22, an m-bit data indicative of 0.8 ns, which has been read out from the RATE memory 24 for retainment therein in accord with the preceding basic period 7.5 ns, is read out (FIG. 8 (I)). Furthermore, a j-bit data corresponding to a jitter amplitude value p3 is read out from the jitter generating circuit 32 (FIG. 8 (J)).

An m-bit data indicative of 3.0 ns read out from the timing memory 12, and an addition result 4.3 ns (=3.5+0.8) of the adder 30 are inputted to the adder 26. As a result of the addition of these data, a carry and an m-bit data indicative of 3.3 ns are outputted. Thus, a carry and an m-bit data equivalent to (3.3+p3) ns are obtained as a result of all the additions using the three adders 26, 28 and 30 (FIG. 8 (K)). If the value p3 is less than 0.7 ns, the results of additions will be 4.0 or less and no carry is produced from the adder 28 at the subsequent stage but a carry is outputted only from the adder 26 at the preceding stage. In this case, since the output signals of the D-type flip flop 18 are selected in the multiplexer 16, the multiplexer 16 outputs signals resulting from delaying the output signals of the coincidence detecting circuit 14 by one period of the REFCLK signals. Thus, during the time corresponding to the high-level zone of the next period of the REFCLK signals, signals for maintaining the high level are outputted from the AND circuit 36 and are inputted to the variable delay circuit 42. The variable delay circuit 42 then outputs the signals inputted from the AND circuit 36 with a delay of (3.3+p3) ns.

If (3.3+p3) ns equals to 4.0 ns or more, a carry produced in the addition operation of the adder 28 is inputted to the multiplexer 16. At the same time, an m-bit data indicative of (3.3+p3-4.0) ns is outputted from the adder 28. In this case, since the output signals of the D-type flip flop 20 are selected in the multiplexer 16 to which two carries have been inputted, the multiplexer 16 outputs signals resulting from delaying the output signals of the coincidence detecting circuit 14 by two periods of the REFCLK signals. Accordingly, during the time corresponding to the high-level zones in the two periods ahead of the REFCLK signals, the AND circuit 36 outputs signals for maintaining the high level, which signals are inputted to the variable delay circuit 42. Thus, the variable delay circuit 42 outputs signals, which have been inputted from the AND circuit 36, with a delay of (3.3+p3-4.0) ns.

The jitter amplitude values p1, p2 and p3 outputted from the jitter generating circuit 32 are changed every period of the REFCLK signals in the configurations shown in FIGS. 4 and 6. However, since these values are not necessarily changed every period of the REFCLK signals in the configurations shown in FIGS. 5 and 7, the same value may be continuously maintained in some cases.

As described above, in the timing generator 120 according to the present embodiment, use of the variable delay circuit 42 for the generation of the timing edges readily allows addition of jitter to a timing edge by changing the delay time in the variable delay circuit 42 during the time equivalent to each of the jitter amplitude values. In particular, jitter can be added to the timing edge as an output signal, if only digital circuits (the jitter generating circuit 32 and the adder 28) for performing addition of the jitter amplitude value are additionally provided in the configuration for setting the delay time in the variable delay circuit 42. This unnecessitates additional, and a combination with, analog circuits, and enables reduction of the circuit scale and power consumption.

The jitter generation unit mentioned above preferably outputs the jitter amplitude values which alter in a sinusoidal manner synchronizing with the output of the timing edges. Thus, sinusoidal jitter can be readily added to output signals, the sinusoidal jitter having very high frequency being in synchronization with the output of the timing edges.

The jitter generation unit mentioned above preferably outputs the jitter amplitude values which alter at random synchronizing with the output of the timing edges. Thus, random jitter can be readily added to output signals, the random jitter having very high frequency being in synchronization with the output of the timing edges.

The jitter generation unit mentioned above preferably outputs the jitter amplitude values whose updating intervals alter at random. By making the intervals for adding jitter components uneven, random jitter having enhanced random properties can be added.

In the timing generator 120 according to the present embodiment, in case the delay time from the start timing of the basic period is equivalent to the time of one period or more of the reference clock signals, it is arranged so that carries are outputted from the adders 26 and 28, and so that outputs of either one of the D-type flip flops 18 and 20 are selected by the multiplexer 16. Accordingly, the timing for generating the timing edges is ensured to be delayed by the time equivalent to an integral multiple of the period of the reference clock signals.

In case the start timing of the basic period and the input timing of the reference clock signal do not coincide with each other (the cases of basic periods 7.5 ns and 18.0 ns shown in FIG. 8), addition of the time equivalent to the time lag is performed by using the adder 30 to set delay time for producing the timing edge. Therefore, the start timing of the basic period can be set asynchronously with the reference clock signals, whereby a plurality of basic periods each having arbitrary value can be successively set.

Further, the semiconductor testing apparatus according to the present embodiment is enabled to add jitter to signals inputted to a device under test without the necessity of additionally providing analog circuits, owing to the provision of the timing generator described above. In this way, the circuit scale and power consumption can be reduced in performing the jitter tolerance test by using the semiconductor testing apparatus.

The present invention is not limited to the embodiment described above, but may be modified in various ways within the scope of the present invention. For example, in the embodiment described above, the counter 10 has been adapted to start counting operation when the RATE signal is inputted, so that, when the count value coincides with the value indicated by the n-bit data outputted from MSB of the timing memory 12, high-level signals are outputted from the coincidence detecting circuit 14. However, the equivalent operation may be carried out by using other configurations.

Figure 9:
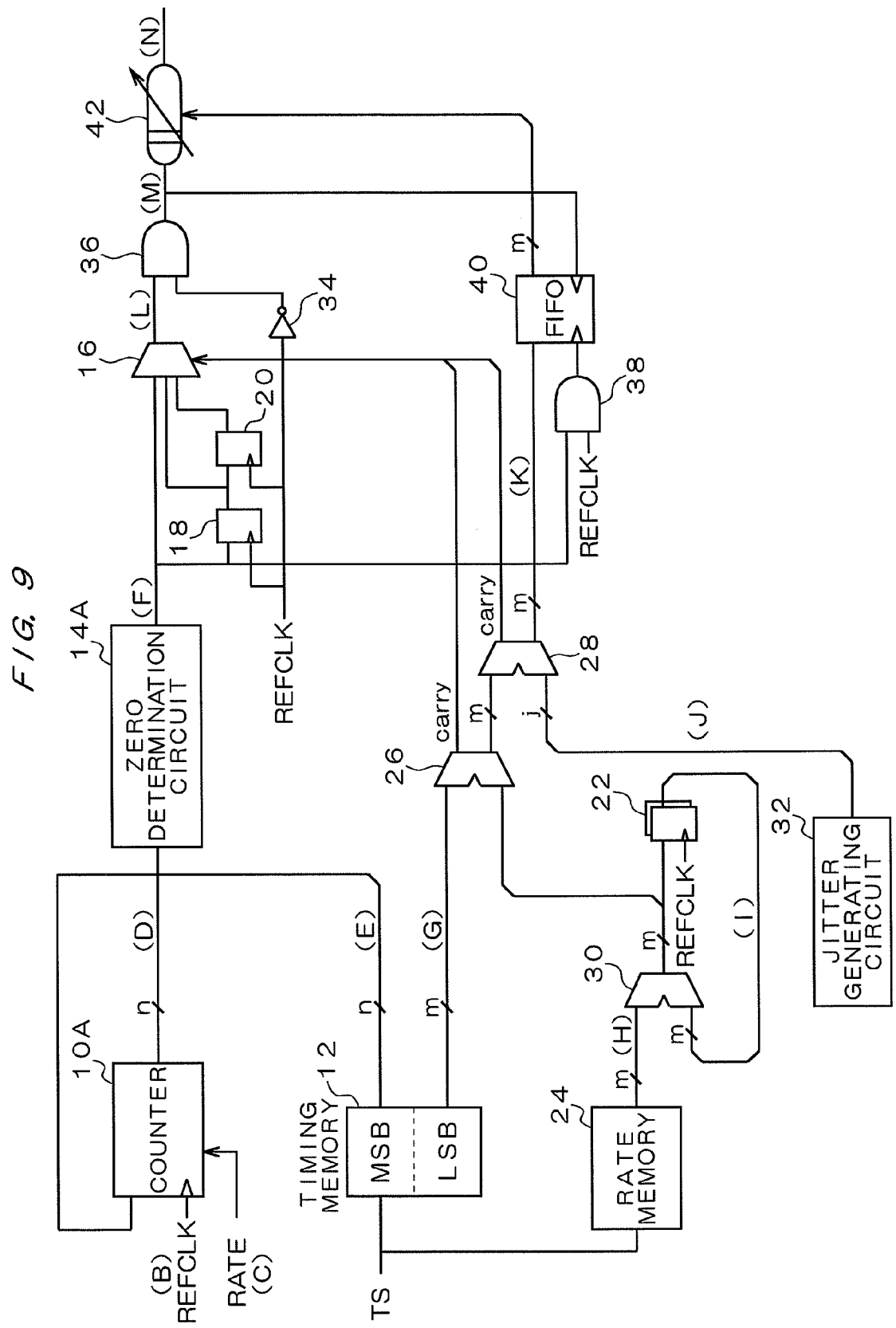
FIG. 9 shows a modification of the timing generator.

FIG. 9 shows a modification of the timing generator. The configuration shown in FIG. 9 is different from the configuration shown in FIG. 2 in that the counter 10 has been replaced by a counter 10A which reduces count value in synchronization with the reference clock signals, and that the coincidence detecting circuit 14 has been replaced by a zero determination circuit (which corresponds to the elapsed time determination unit) 14A for outputting a determination signal by determining that the count value of the counter 10A has become "0". Upon input of the RATE signal, the counter 10A starts counting operation by retrieving the n-bit data outputted from the MSB of the timing memory 12. The zero determination circuit 14A outputs high-level signals when the count value of the counter 10A has become "0". Use of such a configuration may allow the zero determination circuit 14A to output signals having the same contents as those of the output signals of the coincidence detecting circuit 14.

INDUSTRIAL APPLICABILITY

According to the present invention, use of the variable delay unit for the generation of the timing edges readily allows addition of jitter to the timing edge by changing the delay time in the variable delay unit by the time equivalent to the jitter amplitude value. Accordingly, if only a digital circuit for performing addition of the jitter amplitude value is additionally provided in the configuration for setting the delay time of the variable delay unit, jitter can be added to the timing edge as an output signal, thereby reducing the circuit scale and power consumption.

The invention claimed is:
1. A timing generator for generating a timing edge at a specified timing within a basic period comprising;
    a counter for performing counting operation synchronizing with reference clock signals of a predetermined period;
    a timing data output unit for outputting data for each of a quotient and a remainder obtained by dividing time from the start of said basic period to the point of generating said timing edge by the period of said reference signals;

an elapsed time determination unit for determining that time corresponding to said quotient, which is indicated by data outputted from said timing data output unit, has elapsed, on the basis of a count value of said counter, and for outputting a determination signal in accord with the timing of the determination;

a jitter generation unit for outputting time, by which the output timing of said timing edge should be delayed, as a jitter amplitude value;

an adding unit for performing additions of a first time corresponding to said remainder indicated by the data outputted from said timing data output unit, and a second time indicated by said jitter amplitude value outputted from said jitter generation unit; and a variable delay unit to which the determination signal outputted from said elapsed time determination unit is inputted so as to be outputted with a delay by the time indicated by an addition result obtained from said adding unit.

2. The timing generator according to claim 1 wherein, said elapsed time determination unit compares the count value of said counter with said quotient indicated by data outputted from said timing data output unit and outputs said determination signal when the count value and the quotient coincide with each other.

3. The timing generator according to claim 1 wherein, said counter retrieves said quotient as an initial value at the start of said basic period, said quotient being indicated by the data outputted from said timing data output unit, and then performs a counting operation for reducing a count value synchronizing with said reference clock signals; and said elapsed time determination unit outputs said determination signal when the count value of said counter is detected to be 0.

4. The timing generator according to claim 1 wherein, said jitter generation unit outputs said jitter amplitude value which alters in a sinusoidal manner synchronizing with the output of said timing edge.

5. The timing generator according to claim 1 wherein, said jitter generation unit outputs said jitter amplitude value which alters at random synchronizing with the output of said timing edge.

6. The timing generator according to claim 1 wherein, said jitter generation unit outputs said jitter amplitude value whose updating interval alters at random.

7. The timing generator according to claim 1 wherein, said adding unit, when an addition result corresponding to one period or more of said reference clock signals has been obtained, outputs a carry and an addition result of less than one period of said reference clock signals based on the former addition result; and an input timing delay unit is further provided so that, when said carry is outputted, the timing for inputting said determination signal, which is outputted from said elapsed time determination unit, into said variable delay unit can be delayed during the time corresponding to an integral multiple of the period of said reference clock signals.

8. The timing generator according to claim 1 wherein, said adding unit further performs addition of time, which is equivalent to a time lag, to said first time and said second time, the time lag being caused when the start timing of said basic period and the input timing of said reference clock signal do not coincide with each other.

9. A semiconductor testing apparatus comprising:

the timing generator recited in claim 1;

a pattern generator for generating a pattern data to be inputted to each of pins of a device under test;

a data selector for correlating each of the various pattern data outputted from said pattern generator to each of the pins of said device under test to which the pattern data is inputted;

a format controlling section for controlling a waveform for said device under test, based on the pattern data outputted from said data selector and said timing edge generated by said timing generator; and a digital comparing section for comparing data outputted from each of the pins of said device under test with an expected value data of each of the pins.

* * * * *